(12) United States Patent
Soeta et al.

(10) Patent No.: US 7,776,719 B2
(45) Date of Patent: Aug. 17, 2010

(54) METHOD FOR MANUFACTURING BONDED WAFER

(75) Inventors: Yasutsugu Soeta, Gunma (JP); Nobuhiko Noto, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/227,436

(22) PCT Filed: May 14, 2007

(86) PCT No.: PCT/JP2007/059864

§ 371 (c)(1), (2), (4) Date: Nov. 18, 2008

(87) PCT Pub. No.: WO2007/138848

PCT Pub. Date: Dec. 6, 2007

(65) Prior Publication Data

US 2009/0170285 A1    Jul. 2, 2009

(30) Foreign Application Priority Data

May 29, 2006 (JP) .............................. 2006-147915

(51) Int. Cl.
*H01L 21/46* (2006.01)
(52) U.S. Cl. .................. 438/458; 438/455; 438/459; 257/E21.568
(58) Field of Classification Search .................. None
See application file for complete search history.

(56) References Cited

U.S. PATENT DOCUMENTS

| 5,108,535 A | * | 4/1992 | Ono et al. .............. 156/345.35 |
| 5,863,829 A | | 1/1999 | Nakayoshi et al. |
| 6,140,210 A | | 10/2000 | Aga et al. |
| 6,797,632 B1 | | 9/2004 | Nakano et al. |
| 2003/0019580 A1 | * | 1/2003 | Strang .................... 156/345.33 |
| 2004/0063329 A1 | | 4/2004 | Yanagisawa et al. |
| 2005/0013927 A1 | | 1/2005 | Yamazaki |

FOREIGN PATENT DOCUMENTS

| CN | 1745461 A | 3/2006 |
| EP | 1 758 168 A1 | 2/2007 |
| JP | A-09-064321 | 3/1997 |

(Continued)

OTHER PUBLICATIONS

Nov. 27, 2009 Office Action issued in Chinese Patent Application No. 2007800196176 (with partial translation).

*Primary Examiner*—Minh N Tang
(74) *Attorney, Agent, or Firm*—Oliff & Berridge, PLC (57) ABSTRACT

A method is provided for manufacturing a bonded wafer by an ion implantation delamination method, including bonding a base wafer with a bond wafer having a microbubble layer formed by ion implantation, delaminating the wafers along the micro bubble layer as a boundary, and removing a periphery of a thin film formed on the base wafer by the delamination. The removal step is performed by dry etching that supplies an etching gas from a nozzle, and the dry etching is performed by adjusting an inner diameter of the gas-jetting port of the nozzle, and a distance between the gas-jetting port of the nozzle and a surface of the thin film.

5 Claims, 4 Drawing Sheets

FOREIGN PATENT DOCUMENTS

| | | |
|---|---|---|
| JP | A-11-102848 | 4/1999 |
| JP | A-2003-298030 | 10/2003 |
| JP | A-2004-128079 | 4/2004 |
| JP | A-2004-134661 | 4/2004 |
| JP | A-2004-235407 | 8/2004 |
| JP | A-2004-319285 | 11/2004 |
| JP | A-2005-340622 | 12/2005 |
| WO | WO 01/27999 A1 | 4/2001 |
| WO | WO 2004/070809 A1 | 8/2004 |

\* cited by examiner

METHOD FOR MANUFACTURING BONDED WAFER

TECHNICAL FIELD

The present invention relates to a method for manufacturing a bonded wafer by an ion implantation delamination method, the method including the steps of bonding a base wafer with a bond wafer having a microbubble layer formed by ion implantation, delaminating the bonded wafer along the microbubble layer as a boundary, and removing the periphery of a thin film formed on the base wafer by the delamination step.

BACKGROUND ART

As wafers manufactured by a bonding method, there is a SOI wafer having a SOI layer (thin film) formed on a silicon oxide film being an insulator, for example. The SOI wafer has characteristics, such as small parasitic capacitance, high radioactivity resistance, and the like, since the SOI layer in a substrate surface portion to be used as a device fabricating area is electrically separated by the silicon oxide film (buried oxide film layer (BOX layer)) from the inside of the substrate. For that reason, the SOI wafer is expected to provide effects such as high speed and low-power consumption operation, prevention of soft-error, or the like, and thus it is considered as a promising substrate for high performance semiconductor device.

It is possible to manufacture the above-described bonded wafer by, for example, an ion implantation delamination method.

In this ion implantation delamination method (also called Smart-Cut (registered trademark) method), a base wafer and a bond wafer having a microbubble layer formed by implanting ions such as hydrogen ions or the like are bonded with each other (bonding step), the bonded wafer is delaminated along a microbubble layer as a boundary (delamination step), and a thin film is formed on the base wafer.

In this case, since there is polishing sag near the edge of the wafer, the bonding strength of the bonded wafer is reduced as closing to an outermost periphery. Hence, the thin film in an area around 2 mm from the edge is not usually transferred to the base wafer. As a result, in this boundary where transference of the thin film become discontinuous, the delamination is not caused in the microbubble layer but is caused by the thin film on the surface layer being broken (for example, refer to International Publication Pamphlet Wo01/027999).

Figure 5:
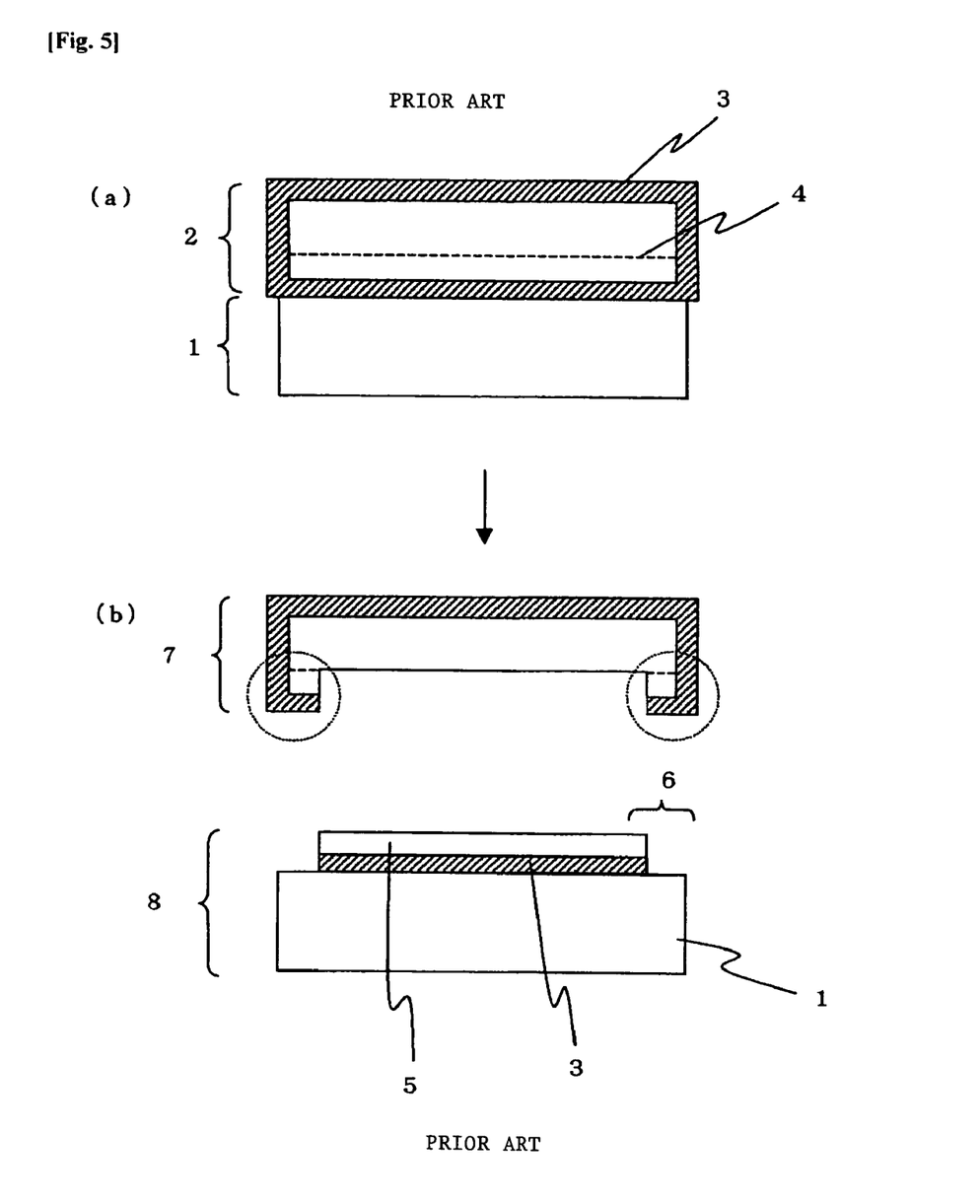
FIG. 5 is an explanatory drawing showing an aspect in a delamination step.

The aspect will be shown in FIG. 5. After bonding a base wafer 1 with a bond wafer 2 having a microbubble layer 4 via an insulator 3 (FIG. 5(a)), the bonded wafer is delaminated along the microbubble layer 4 as a boundary (FIG. 5(b)). Thus, the bonded wafer is separated into a delaminated wafer 7 and a bonded wafer 8 having a thin film 5 formed thereon. As shown in FIG. 5(b), however, the delamination is caused by the thin film on the surface layer being broken (circled portions) in the boundary where transference of the thin film 5 becomes discontinuous on the way.

For this reason, surface geometry of a periphery 6 (commonly known as a terrace) of the thin film on the bonded wafer 8 does not result in controlled geometry, but it is indented like a ria, and furthermore, the periphery is dotted with many isolated islands. Cracks occur due to an effect of corrosion by performing oxidization and cleaning (including cleaning for removal an oxide film) from the periphery 6 of the thin film in such conditions during processes after the delamination, and breaks or chippings also occur, so that this leads to a cause of particle generation.

In order to solve such problems, there is commonly employed a method in which the periphery of the thin film is removed after the delamination step (thin-film periphery removal step). For example, there are described in International Publication Pamphlet WO01/027999 a method for masking an area except the periphery of the thin film to then remove the periphery of the thin film by wet etching, and a method for locally polishing only the periphery of the thin film.

However, since the method by above-described wet etching requires masking the thin film, a masking agent will directly contact with the surface of the thin film, so that there is a concern of generation of scratches or impurity contamination. There is a concern also in the above-described polishing method that a removal width cannot be reproducibly obtained well by an effect of irregular touch due to a temporal change in a polishing pad (buff). Moreover, these methods are not easy to perform because of the need to form the mask to the thin film.

Further, it is also required from a viewpoint of quality of the thin film not to degrade uniformity in film thickness of the thin film left after the removal upon removing the periphery of the thin film.

DISCLOSURE OF THE INVENTION

The present invention is made in view of such problems, and an object thereof is to provide a method for manufacturing a bonded wafer, in which removal of the thin-film periphery can be easily performed and the removal width can also be reproducibly obtained well in the thin-film periphery removal step, and degradation in quality of the thin film can be prevented.

In order to achieve the above-described object, the present invention provides a method for manufacturing a bonded wafer by an ion implantation delamination method including at least the steps of bonding a base wafer with a bond wafer having a microbubble layer formed by ion implantation, delaminating the wafers along the micro bubble layer as a boundary, and removing a periphery of a thin film formed on the base wafer by the delamination step, wherein at least the thin-film periphery removal step after the delamination step is performed by dry etching that supplies an etching gas from a nozzle, and the dry etching is performed by adjusting an inner diameter of a gas-jetting port of the nozzle, and a distance between the gas jetting-port of the nozzle and a surface of the thin film.

As described above, in the method for manufacturing the bonded wafer according to the present invention, the thin-film periphery removal step after the delamination step is performed by dry etching that supplies the etching gas from the nozzle, and the dry etching is performed by adjusting the inner diameter of the gas jetting-port of the nozzle, and the distance between the gas jetting-port of the nozzle and the surface of the thin film. Hence, removal of the thin-film periphery can be easily performed and the removal width can also be reproducibly obtained well, and degradation in quality of the thin film can be prevented.

In addition, the bonded wafer manufactured by the above-described method of the present invention has good quality in the periphery of the thin film, and it is possible to greatly reduce particles generated therefrom.

Here, in the present invention, "dry etching is performed by adjusting the inner diameter of the gas-jetting port of the nozzle, and the distance between the gas-jetting port of the nozzle and the surface of the thin film" means that dry etching is performed by adjusting so that sag of the film thickness in an area within 6 mm from the outermost periphery of the wafer falls not more than 5% of a set film thickness of the thin film, and preferably, not more than 3% thereof after termination of the etching, and these specific setting conditions are appropriately selected in consideration of a size of an effective area of the thin film depending on the sag geometry of the periphery thereof, and a throughput of dry etching.

Further, in the method for manufacturing the bonded wafer of the present invention, the inner diameter of the gas-jetting port of the nozzle is preferably adjusted to not more than 1 mm.

As described above, adjusting the inner diameter of the gas-jetting port of the nozzle not more than 1 mm makes it possible to enhance film thickness uniformity in the periphery of the thin film after etching, and to form its geometry with little sag.

Still further, in the method for manufacturing the bonded wafer of the present invention, the distance between the gas-jetting port of the nozzle and the surface of the thin film is preferably adjusted to not more than 0.5 mm.

As described above, adjusting the distance between the gas-jetting port of the nozzle and the surface of the thin film not more than 0.5 mm makes it possible to further improve the film thickness uniformity in the periphery of the thin film after etching.

Yet still further, in the method for manufacturing the bonded wafer of the present invention, the thin-film periphery removal step is preferably performed after a film thickness adjustment step in which the thin film formed on the base wafer by the delamination step is adjusted to a predetermined film thickness.

For example, in the case of the SOI wafer having the SOI layer (thin film) formed on the silicon oxide film (buried oxide film (BOX)) being an insulator, the film thickness adjustment of the SOI layer (thin film) is usually performed by sacrificial oxidation and oxide film removal. However, the buried oxide film (BOX) is corroded with HF solution used for removing oxide film, the thin film near the terrace becomes an overhung shape slightly, and that portion may be in an unstable state in strength. Consequently, even when a portion of an overhung shape is formed on the thin film, this portion can be removed by performing the thin-film periphery removal step after the film thickness adjustment step as described above, and it is possible to effectively prevent the particles, such as pieces of Si, from being generated.

Yet still further, in the method for manufacturing the bonded wafer of the present invention, the thickness of the thin film can be adjusted to less than 1 μm.

If the thickness of the thin film is less than 1 μm, film thickness variation of the thin film near the terrace may change greatly when trying to remove the periphery of the thin film with a conventional method. For this reason, it has been difficult to remove the periphery of the thin film without degrading the film thickness uniformity of the thin film near the terrace. According to the above-described method for manufacturing the bonded wafer of the present invention, however, the periphery of the thin film can be removed almost without degrading the film thickness uniformity of the thin film even when the thickness of the thin film is less than 1 μm.

As explained above, in the method for manufacturing the bonded wafer of the present invention, the thin-film periphery removal step after the delamination step is performed by dry etching that supplies the etching gas from the nozzle, and the dry etching is performed while adjusting the inner diameter of the gas-jetting port of the nozzle, and the distance between the gas-jetting port of the nozzle and the surface of the thin film. Therefore, removal of the thin-film periphery can be easily performed and the removal width can also be reproducibly obtained well, and degradation in quality of the thin film after the removal of the periphery can be prevented.

BEST MODE(S) FOR CARRYING OUT THE INVENTION

Hereinafter, the present invention will be explained in more detail.

As described above, there arises a problem that quality in a thin film is degraded when a thin-film periphery removal step is performed by conventional wet etching, whereas there arises a problem that a removal width cannot be reproducibly obtained well when it is performed by conventional polishing. There are also problems in these methods that the steps are not simple and manufacturing cost increases, such that it is required to form a mask to the thin film.

Consequently, in order to solve these problems, the present inventors considered whether or not the thin-film periphery removal step could be performed by another method.

Here, in order to remove poor bonded areas, a technology of removing the periphery of the thin film by dry etching is described in Japanese Unexamined Patent Publication (Kokai) No. 2003-298030. The technology is such that after bonding a bond wafer with a base wafer, a thin film is formed by grinding and polishing the bond wafer, a mask is then formed on the formed thin film except for the periphery thereof, and the exposed periphery of the thin film is removed by dry etching.

However, as is obvious from the description in an embodiment that the etching amount of dry etching is 1 to 50 μm, this technology is directed to a relatively thick thin film. Accordingly, when this technology is simply applied to the thin film with less than 1 μm thickness to remove the periphery thereof, film thickness variation of the thin film near the terrace becomes large, thereby causing a problem that the effective area of the thin film is reduced. Additionally, since the mask is formed on the thin film in this method, the concern of generating scratches of the thin film or impurity contamination is the same. Further, this method forms the thin film by grinding and polishing, and it is not applicable to an ultra thin film with less than 1 μm thickness such as an ion implantation delamination method.

However, as a result of further investigation, the present inventors found out that when the thin-film periphery removal step is performed by dry etching by supplying an etching gas from a nozzle, the thin-film periphery can be removed easily, and this dry etching reproducibly provides the removal width well by being performed while adjusting an inner diameter of a gas-jetting port of the nozzle, and a distance between the gas-jetting port of the nozzle and a surface of the thin film, and further, even when the film is ultra thin such as a case of the ion implantation delamination method, degradation in quality of the thin film after the periphery removal can be effectively prevented, to thereby complete the present invention.

Hereinafter, the present invention will be explained more specifically referring to drawings. However, the present invention is not limited to them.

Figure 1:
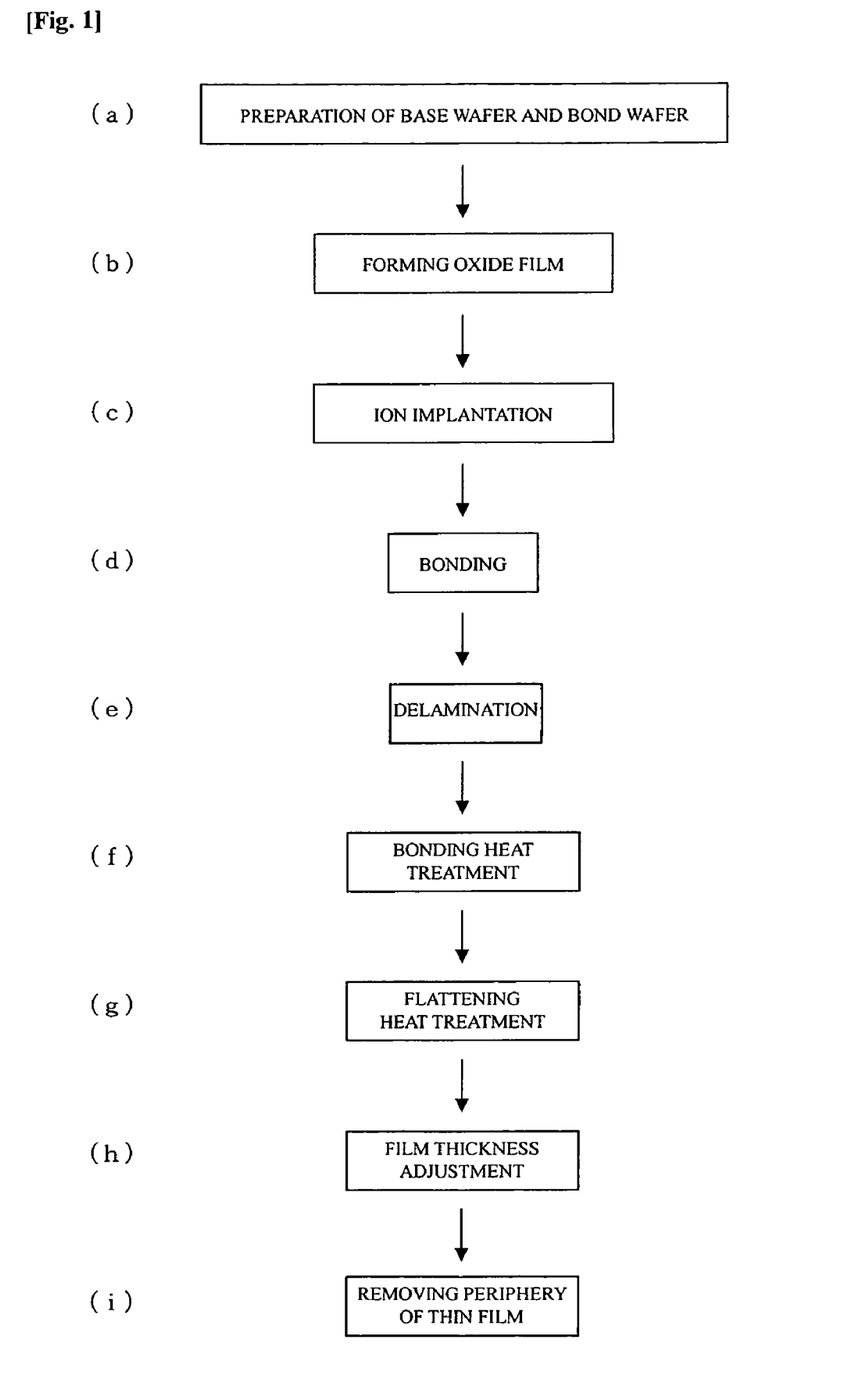
FIG. 1 is a flow chart showing an example of a method for manufacturing a bonded wafer of the present invention.

FIG. 1 is a flow chart showing an example of a method for manufacturing a bonded wafer of the present invention.

In the method for manufacturing the bonded wafer shown in FIG. 1, a base wafer and a bond wafer having a microbubble layer formed by ion implantation are bonded with each other and the bonded wafer is delaminated along a microbubble layer as a boundary and so on by steps (a) to (h) described later, and subsequently a thin-film periphery removal step (i) is performed.

Incidentally, this thin-film periphery removal step (i) is performed by dry etching by supplying an etching gas from the nozzle.

Figure 2:
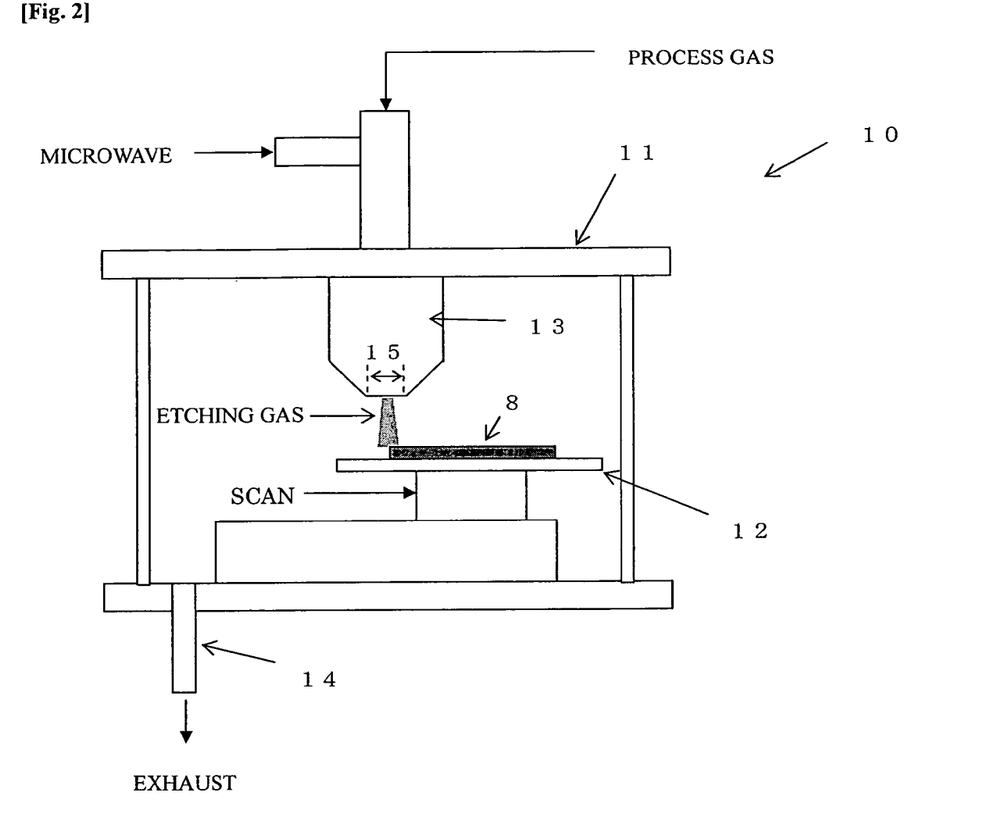
FIG. 2 is a schematic view showing an example of a dry etching system, which can be used, in the present invention.

At this time, dry etching can be performed using a system shown in FIG. 2, for example.

This dry etching system 10 includes a chamber 11, a stage 12 on which a bonded wafer 8 is placed, a nozzle 13 for spraying the etching gas on the bonded wafer 8, and an outlet 14 for exhausting gas out of the chamber 11. The nozzle 13 has a gas-jetting port 15 for jetting out the etching gas.

Note that the stage 12 can be moved freely in a horizontal plane by a drive mechanism, which is not shown.

The periphery of the thin film is removed using this dry etching system 10 as follows.

Namely, while making a process gas, such as $SF_6$, $NF_3$, or $CF_4$, flow into an upper portion of the nozzle 13, microwaves generated by a microwave generator (not shown) is radiated. Thereby, the process gas in the nozzle 13 is turned into plasma to generate an active species gas (etching gas). This etching gas is jet from the gas-jetting port 15 at the tip of the nozzle 13. Next, the periphery of the thin film is removed by spraying this jet etching gas thereon while moving the bonded wafer 8 on the stage 12.

At this time, the inner diameter of the gas-jetting port 15 of the nozzle 13 is preferably adjusted to not more than 1 mm.

Adjusting the inner diameter of the gas-jetting port of the nozzle not more than 1 mm makes it possible to enhance film thickness uniformity in the periphery of the thin film left after etching, and to form its geometry with little sag. Meanwhile, in order not to reduce an etching rate extremely, the inner diameter of the gas-jetting port 15 of the nozzle 13 is preferably set not less than 0.1 mm.

In order to further improve the film thickness uniformity in the periphery of the thin film left after etching, the distance between the gas-jetting port 15 of the nozzle 13 and the surface of the thin film is preferably adjusted to not more than 0.5 mm. This adjustment can be performed by changing height for fixing the nozzle 13. In this case, since there is a possibility that the nozzle and the thin film may contact with each other during etching if the distance is set less than 0.1 mm, the distance is preferably set not less than 0.1 mm.

As described above, if the periphery of the thin film is removed by local gas phase chemical dry etching with non-contact and non-damage processing by supplying the etching gas from the nozzle, it is not necessary to form the mask to the thin film. In addition, since the periphery of the thin film can be etched at a uniform width and depth, the periphery of the thin film can be cleanly removed and the removal width can also be reproducibly obtained well. For this reason, in the case of a bonded wafer of, for example, 300 mm in diameter, the effective area of the thin film can be extended to 6 mm, specifically not more than 3 to 2 mm from the outermost periphery. Further, even when the thickness of the thin film is less than 1 μm, the film thickness uniformity of the thin film is hardly degraded. For this reason, the thin-film periphery can be easily removed and the removal width can also be reproducibly obtained well, and degradation in quality of the thin film after the removal of the periphery can be prevented.

Moreover, the bonded wafer thus manufactured has good quality in the periphery of the thin film, and it is possible to greatly reduce particles generated therefrom.

Hereinafter, steps (a) to (h) performed before step (i) will be specifically explained taking an example when a SOI wafer is manufactured as the bonded wafer.

First, the base wafer to be a supporting substrate and the bond wafer to be the thin film are prepared at step (a).

As the base wafer and the bond wafer, wafers made of silicon single crystal are used, for example.

Next, a silicon oxide film to be an insulator is formed on the bond wafer at step (b).

Although the silicon oxide film can be formed by, for example, wet oxidation or dry oxidation, a method such as CVD (Chemical Vapor Deposition) or the like may also be employed. The film thickness of the silicon oxide film is arbitrarily selected according to product specifications.

It is to be noted that although the silicon oxide film is formed to use it as the insulator in the above example, a silicon nitride film, a silicon oxidization nitride film, or the like may also be formed as the insulator. A substrate such as quartz, silicon carbide, alumina, or the like may further be used as the base wafer to be the insulator. However, the silicon oxide film has advantages that a film with dense film quality can be easily formed using wet oxidation, dry oxidation, or the like. Further, the silicon oxide film may be formed on the base wafer, or may be formed on both the bond wafer and the base wafer.

Next, at least either hydrogen ions or rare gas ions are implanted into one surface of the bond wafer on which the oxide film formed at step (c).

The microbubble layer parallel to the front surface of the bond wafer is formed in an average penetration depth of ions by this ion implantation. An implantation temperature at this time may be set to 25 to 450° C., for example.

Next, the base wafer and the bond wafer having the microbubble layer formed by ion implantation are bonded with each other at step (d).

A front surface of the base wafer and a surface into which ions are implanted of the bond wafer are contacted with each other via the silicon oxide film under a clear atmosphere at room temperature; thereby the two wafers are bonded with each other without using an adhesive or the like.

Next, the bonded wafer is delaminated along the microbubble layer as the boundary at step (e).

Thereby, it is separated into a delaminated wafer and a SOI wafer in which the thin film (SOI layer) is formed on the base wafer via the silicon oxide film (refer to FIG. 5).

At this delamination step, if heat treatment is performed, for example at a temperature of not less than about 500° C. under an inert gas atmosphere, the bonded wafer is separated into the delaminated wafer and the SOI wafer by rearrangement of the crystals and aggregation of the bubbles.

It is to be understood that the contact surfaces of both wafers are subjected to plasma treatment in advance as a previous step of contacting the front surface of the bond wafer with that of the base wafer; thereby the bonded wafer can be mechanically delaminated along the microbubble layer without performing heat treatment after the bonding.

At this time, the delamination is caused by the SOI layer of the surface layer being broken (circled portions) in the boundary where transference of the SOI layer 5 becomes discontinuous on the way as shown in FIG. 5(*b*). For this reason, the surface geometry of the periphery 6 of the SOI layer does not result in the controlled geometry, but it is indented like a ria, and furthermore, the periphery is dotted with many isolated islands. This leads to a cause of particle generation. In the present invention, however, the periphery of this SOI layer is removed cleanly by the subsequent step (i) as described above. For this reason, the particle generation can be greatly reduced.

Next, the SOI wafer is subjected to bonding heat treatment at step (f).

Bonding strength between the wafers bonded by the above-described bonding step (d) and delamination step (e) is too weak to use in device fabricating steps as it is. For this reason, the bonded wafer is subjected to the heat treatment at high temperature as the bonding heat treatment to secure sufficient bonding strength at step (f). This heat treatment is preferably performed, for example, at 1050 to 1200° C. for 30 minutes to two hours under an inert gas or an oxidized gas atmosphere. Note that, such bonding heat treatment step (f) may also be omitted by raising a temperature of the heat treatment at delamination step (e).

Next, the SOI wafer is subjected to flattening heat treatment at step (g).

This flattening heat treatment is to further flatten the surface of the SOI layer, and it can be performed at the temperature of about 1100 to 1200° C. for a short time, such as for about one to five hours in an inert gas, such as an argon gas, or a hydrogen gas, or a mixed gas thereof. This flattening heat treatment can be performed along with the above-described bonding heat treatment.

Subsequently, film thickness adjustment for adjusting a film thickness of the SOI layer to a predetermined film thickness is performed at step (h).

In the case of the SOI wafer in which the SOI layer is formed on the silicon oxide film (buried oxide film (BOX)), the film thickness adjustment of the SOI layer is usually performed by sacrificial oxidation and oxide film removal. However, the buried oxide film (BOX) is corroded with HF solution used for removing oxide film, the SOI layer near the terrace becomes an overhung shape slightly, and that portion may be in an unstable state in strength. Hence, even when the portion of the overhung shape is formed on the SOI layer, this portion can be removed by performing thin-film periphery removal step (i) after this film thickness adjustment step (h), so that it is possible to effectively prevent the particles, such as pieces of Si, from being generated.

Hereinafter, the present invention will be described in more detail taking examples of the present invention, but they are not intended to limit the present invention.

EXAMPLE 1

According to the flow chart shown in FIG. 1, a SOI wafer was manufactured as the bonded wafer. First, two silicon single crystal wafers of 300 mm in diameter were prepared as the base wafer and the bond wafer (step (a)).

Next, a silicon oxide film of 400 nm in thickness was formed on a front surface of the bond wafer (step (b)).

Next, hydrogen ions were implanted into one surface of the bond wafer on which the oxide film formed (step (c)). Ion implanting conditions at this time are 90 keV of implantation energy and $6.5 \times 10^{16}/cm^2$ of implantation dose. A microbubble layer parallel to the front surface of the bond wafer was formed in an average penetration depth of ions by this ion implantation.

Next, the base wafer and the bond wafer having the microbubble layer formed by ion implantation were bonded at room temperature via the silicon oxide film (step (d)).

Next, the bonded wafer was delaminated along the microbubble layer as a boundary (step (e)). This delamination step was performed by heat treatment at 500° C. for 30 minutes under a $N_2$ gas atmosphere. Thereby, the bonded wafer was separated into the delaminated wafer and the SOI wafer.

When the periphery of the SOI layer (thin film) of the SOI wafer was observed at this time, the surface geometry of the periphery of the SOI layer was not the controlled geometry, but it was indented like a ria, and furthermore, the periphery was dotted with many isolated islands.

Next, the SOI wafer is subjected to bonding heat treatment (step (f)). This bonding heat treatment step was performed by heat treatment at 1100° C. for 120 minutes under a $N_2$ gas atmosphere.

Next, the SOI wafer is subjected to flattening heat treatment (step (g)). This flattening heat treatment was performed by heat treatment at 1200° C. for 60 minutes under an Ar gas atmosphere.

Next, the film thickness adjustment was performed to adjust the thickness of the SOI layer to 60 nm. This film thickness adjustment was performed by removing the oxide film with a 5% HF solution after sacrificial oxidation (pyrogenic oxidation at 950° C.).

When the periphery of the SOI layer was observed after the film thickness adjustment, the SOI layer became the overhung shape slightly.

Next, the periphery of the SOI layer was removed using the dry etching system 10 shown in FIG. 2 (step (i)).

At this time, the nozzle 13 having the gas-jetting port 15 of 1 mm in inner diameter was used, and the distance from the surface of the SOI layer was set to 1.5 mm. Subsequently, while $SF_6$ gas is made to flow at 250 sccm flow rate, microwaves are radiated from the microwave generator with output power of 500 W to turn the gas into plasma and to thereby generate the etching gas, which was supplied to the periphery (terrace) of the thin film of the SOI wafer 8 from the nozzle 13. At this time, the nozzle 13 was scanned in the periphery of the SOI layer of the bonded wafer 8 by moving the stage 12. Scanning speed was set to 5 mm/sec.

The bonded wafer was manufactured through above steps (a) to (i).

Consequently, stepped geometry of the terrace of the manufactured bonded wafer (change in thickness of the thin film (SOI layer) in a range of 138 to 148 mm radius) is measured and evaluated by an optical film-thickness measuring instrument. The results are shown in FIG. 3.

Figure 3:
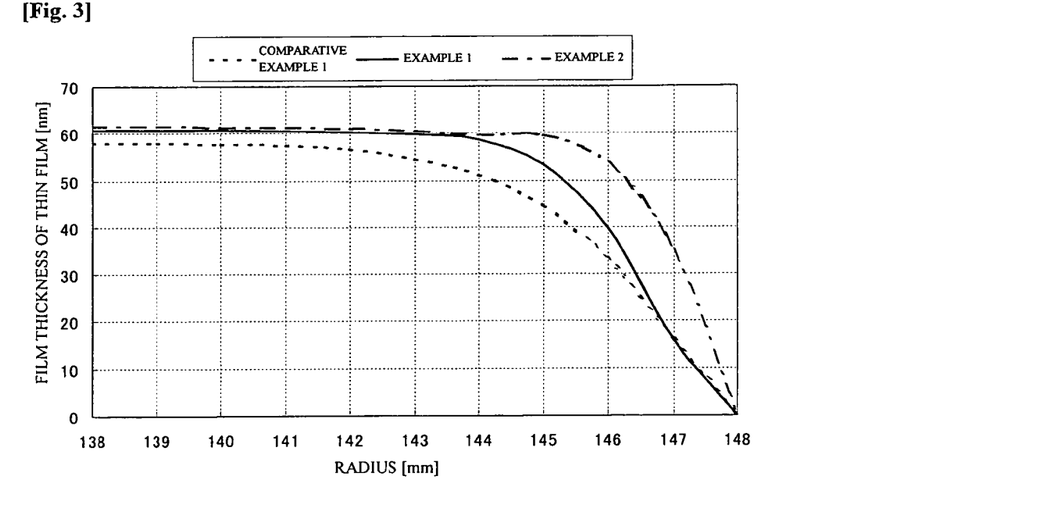
FIG. 3 is a graph showing evaluated results of stepped geometry of a terrace (Example 1, Example 2, and Comparative Example 1)

In Example 1, wherein the nozzle with the gas-jetting port of 1 mm in inner diameter was used, and the distance from the surface of the SOI layer was set to 1.5 mm, it turned out from FIG. 3 that sag in film thickness of the SOI layer in an area of 6 mm from the periphery was about 2 nm (about 3% of a set film thickness), and the area in the range of 6 mm from the periphery (within 144 mm radius) could be an effective area of the SOI layer. Namely, according to a method of Example 1, since the film thickness uniformity of the thin film is hardly degraded, the effective area of the thin film is hardly reduced. The removal width can also be reproducibly obtained well.

Moreover, when observing the periphery of the SOI layer, it was confirmed that controlled quality of the terrace portion was obtained, such that the portion of the overhung shape was removed.

Further, the method of Example 1 was very simple, such that there was no need to form the mask to the SOI layer.

EXAMPLE 2

Except for using a nozzle with the gas-jetting port of 0.2 mm in inner diameter as the nozzle for supplying the etching gas at step (i), the bonded wafer was manufactured in a manner similar to that of Example 1.

Subsequently, the stepped geometry of the terrace of the manufactured bonded wafer was measured and evaluated by the optical film-thickness measuring instrument in a manner similar to that of Example 1. The results are shown in FIG. 3.

In Example 2, wherein the nozzle with the gas-jetting port of 0.2 mm in inner diameter was used, and the distance from the surface of the SOI layer was set to 1.5 mm, it turned out from FIG. 3 that the sag in film thickness of the SOI layer was hardly found in the area of 5 mm from the periphery, and the area in the range of 5 mm from the periphery (within 145 mm radius) could be the effective area of the SOI layer. Namely, according to a method of Example 2, since the film thickness uniformity of the thin film is hardly degraded, the effective area of the thin film is hardly reduced. The removal width can also be reproducibly obtained well.

Moreover, when observing the periphery of the SOI layer, it was confirmed that controlled quality of the terrace portion was obtained, such that the portion of the overhung shape was removed.

Further, the method of Example 2 was very simple, such that there was no need to form the mask to the SOI layer.

COMPARATIVE EXAMPLE 1

Except for using a nozzle with the gas-jetting port of 8 mm in inner diameter as the nozzle for supplying the etching gas at step (i), the bonded wafer was manufactured in a manner similar to that of Example 1. (However, the film thickness of the SOI layer in Comparative example 1 is 58 nm.)

Subsequently, the stepped geometry of the terrace of the manufactured bonded wafer was evaluated in a manner similar to that of Example 1. The results are shown in FIG. 3.

In Comparative example 1, wherein the nozzle with the gas-jetting port of 8 mm in inner diameter is used, it turns out from FIG. 3 that the sag in film thickness of the SOI layer in the area of 6 mm from the periphery is about 7 nm (about 12% of a set film thickness), and the sag geometry is spread up to a range of about 8 to 10 mm from the periphery. Namely, according to a method of Comparative example 1, the film thickness variation of the thin film near the terrace is increased, and the effective area of the thin film is reduced. The removal width cannot be reproducibly obtained well, either.

EXAMPLE 3

Except for setting the distance between the gas-jetting port of the nozzle and the surface of the SOI layer to 0.5 mm at step (i), the bonded wafer was manufactured in a manner similar to that of Example 1.

Figure 4:
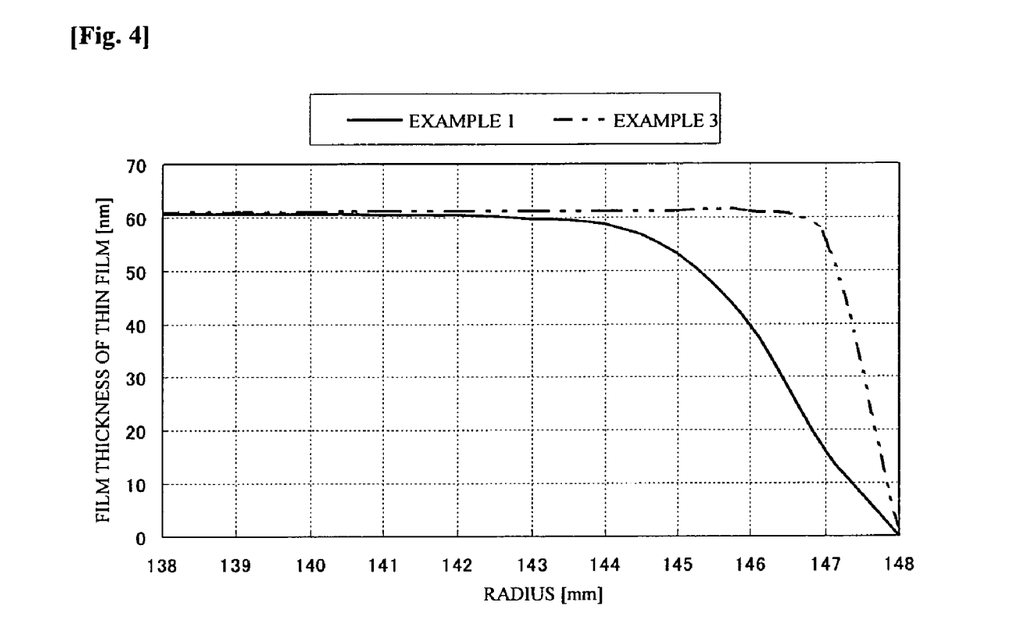
FIG. 4 is a graph showing evaluated results of stepped geometry of the terrace (Example 1 and Example 3)

Subsequently, the stepped geometry of the terrace of the manufactured bonded wafer was measured and evaluated by the optical film-thickness measuring instrument in a manner similar to that of Example 1. The results are shown in FIG. 4. Incidentally, the measured results in Example 1 were also shown in FIG. 4.

In Example 3, wherein the nozzle with the gas-jetting port of 1 mm in inner diameter was used, and the distance from the surface of the SOI layer was set to 0.5 mm, it turned out from FIG. 4 that the sag in film thickness of the SOI layer was hardly found in the area of 3.5 mm from the periphery, and the area in the range of 3 mm from the periphery (within 147 mm radius) could be the effective area of the SOI layer. Namely, according to a method of Example 3, since the film thickness uniformity of the thin film is hardly degraded, the effective area of the thin film is hardly reduced. The removal width can also be reproducibly obtained well.

Moreover, when observing the periphery of the SOI layer, it was confirmed that controlled quality of the terrace portion was obtained, such that the portion of the overhung shape was removed.

Further, the method of Example 3 was very simple, such that there was no need to form the mask to the SOI layer.

Note that the present invention is not limited to the above embodiments. The above described embodiments are just illustrative examples, and have substantially the same configurations as technical ideas described in the claims of the present invention, and all that have similar effects is to be encompassed in the technical scope of the present invention.

The invention claimed is:

1. A method for manufacturing a bonded wafer by an ion implantation delamination process, the method comprising the steps of:

forming a bonded structure by bonding a bond wafer on a base wafer so that a bottom surface of the bond wafer is in direct contact with a top surface of the base wafer, the bond wafer having a microbubble layer formed by ion implantation, the microbubble layer being within the bond wafer and being parallel to the bottom surface of the bond wafer, the microbubble layer defining a thin film of the bond wafer between the microbubble layer and the bottom surface of the bond wafer with other portion of the bond wafer above the microbubble layer;

separating the bonded structure into a delamination wafer and a bonded wafer along the microbubble layer as a boundary, the bonded wafer including the base wafer having the thin film of the bond wafer formed on the top surface of the base wafer, the delamination wafer including the other portion of the bond wafer;

adjusting the thin film formed on the base wafer to a predetermined film thickness; and removing a periphery of the adjusted thin film formed on the base wafer by dry etching that supplies an etching gas from a nozzle, and the dry etching is performed by adjusting an inner diameter of a gas-jetting port of the nozzle to not more than 1 mm, and adjusting a distance between the gas-jetting port of the nozzle and a surface of the thin film.

2. The method for manufacturing the bonded wafer according to claim 1, wherein the distance between the gas-jetting port of the nozzle and the surface of the thin film is adjusted to not more than 0.5 mm.

3. The method for manufacturing the bonded wafer according to claim 2, wherein the thickness of the thin film is adjusted to less than 1 µm.

4. The method for manufacturing the bonded wafer according to claim 1, wherein the thickness of the thin film is adjusted to less than 1 µm.

5. The method for manufacturing the bonded wafer according to claim 1, wherein the bonded wafer is a SOI wafer and the film thickness adjustment step is performed by sacrificial oxidation and oxide film removal.

* * * * *